United States Patent [19]
Endo et al.

[11] Patent Number: 5,406,093
[45] Date of Patent: Apr. 11, 1995

[54] GAP PURE GREEN LIGHT EMITTING ELEMENT SUBSTRATE

[75] Inventors: Masahisa Endo, Matsuida; Akio Nakamura, Annaka; Susumu Higuchi, Takasaki, all of Japan

[73] Assignee: Shin-Etsu Handotai Co., Ltd., Tokyo, Japan

[21] Appl. No.: 230,538

[22] Filed: Apr. 20, 1994

[30] Foreign Application Priority Data

May 31, 1993 [JP] Japan .................. 5-154168

[51] Int. Cl.$^6$ .......................... H01L 33/00
[52] U.S. Cl. .................... 257/101; 257/102; 257/103
[58] Field of Search ............ 257/79, 101, 102, 103

[56] References Cited

U.S. PATENT DOCUMENTS 4,562,378 12/1985 Tadanobu et al. ............ 257/103
4,965,644 10/1990 Kawabata et al. ............ 257/101

FOREIGN PATENT DOCUMENTS 59-18688  1/1984  Japan .................. 257/101
1-245569  9/1989  Japan .................. 257/101
4-266074  9/1992  Japan .................. 257/101

*Primary Examiner*—Rolf Hille
*Assistant Examiner*—Minhloan Tran
*Attorney, Agent, or Firm*—Ronald R. Snider

[57] ABSTRACT

A GaP pure green light emitting element substrate comprising an n-type GaP layer 12 and a p-type GaP layer 14 formed on a GaP single crystal substrate 10, characterized by the fact that an intermediate GaP layer 13 is formed at the pn junction portion between said n-type GaP layer 12 and said p-type GaP layer 14, wherein said intermediate GaP layer has a donor concentration $N_D$ of less than $1 \times 10^{-16}$ atoms/cm$^3$ and an acceptor concentration $N_A$ nearly equal to the donor concentration $N_D$. The thickness of the intermediate GaP layer 13 is in the range of 3–5 micrometers.

3 Claims, 5 Drawing Sheets

[Carrier concentration, cm$^{-3}$]

[Carrier concentration, cm$^{-3}$]

(Note)
$N_D$ : Donor (impurity) concentration
$N_A$ : Acceptor (impurity) concentration
$n = N_D - N_A$ $(N_D > N_A)$
: The carrier concentration or net donor concentration in the n-type layer
$p = N_A - N_D$ $(N_A > N_D)$
: The carrier concentration or net acceptor concentration in the p-type layer

GAP PURE GREEN LIGHT EMITTING ELEMENT SUBSTRATE

BACKGROUND OF THE INVENTION

1. Field of the Invention

This invention relates to a GaP pure green light emitting element substrate, and more precisely to a GaP pure green light emitting element substrate comprising a plurality of GaP layers formed on a GaP single crystal substrate, which is used to manufacture high-brightness GaP pure green light emitting elements.

2. The Prior Art

Light emitting elements such as light emitting diodes are normally obtained by layering a plurality of semiconductor layers on a semiconductor substrate to prepare a multi-layer semiconductor substrate with a pn junction, and then making it into elements for practical use. Among them, green light emitting diodes can be obtained by using a light emitting element substrate prepared by forming one or more layers of both n-type and p-type GaP, one after another, on an n-type GaP single crystal substrate.

GaP is an indirect transition-type semiconductor, and therefore the brightness is very low if a pn junction is just formed. Because of this, nitrogen (N), which would function as light emitting centers, is added to the n-type GaP layer near the pn junction in order to enhance the brightness. However, a light emitting diode prepared from a GaP light emitting element substrate which has the nitrogen-added n-type GaP layer emits a yellowish-green light with a peak wavelength of about 567 nm and therefore it does not give a pure green light with a peak wavelength of about 555 nm.

Because of this, a structure with a lowered carrier concentration in the n-type GaP layer or p-type GaP layer near the pn junction has been proposed for the purpose of otaining pure green light emission with a high brightnes without adding nitrogen.

FIG. 5 shows a cross-sectional structure of a GaP pure green light emitting diode which has an n-type GaP layer with a low carrier concentration (net donor concentration) formed on an n-type GaP layer with a high concentration of the impurity (electrodes are not shown). This type of cross-sectional structure is disclosed in Japanese unexamined patent publication (Tokkai) Sho 59-214276, for example. In this GaP pure green light emitting diode, as shown in FIG. 5 (A), an n-type GaP layer 51, a low-carrier-concentration n-type GaP layer 52 and a p-type GaP layer 53 are formed, one after another, on an n-type GaP single crystal substrate 50, and said low-carrier-concentration n-type GaP layer 52 functions as the light emitting layer.

In this GaP pure green light emitting diode, as shown in FIG. 5 (B), the net donor concentration (n) in the low-carrier-concentration n-type GaP layer 52 is set between $5 \times 10^{15}$ to $1 \times 10^{16}$ atoms/cm$^3$, substantially lower than that in the p-type GaP layer 53. This improves the injection efficiency of the holes from the p-type GaP layer 53 into the low-carrier-concentration n-type GaP layer 52, thus improving the light emitting efficiency.

FIG. 6 shows a structure (electrodes are not shown) of a GaP pure green light emitting diode, which is disclosed in Japanese unexamined patent publication (Tokkai) Sho 57-93589. This GaP pure green light emitting diode has a p-type GaP layer with a lower carrier concentration (p) compared to the carrier concentration (n) in the n-type GaP layer which constitutes one side of the pn junction (said p-type GaP layer being a p-type GaP layer to which impurity as shallow donors has been added so that the net acceptor concentration is lowerd). In this GaP pure green light emitting diode, an n-type GaP layer 61, a low-carrier-concentration p-type GaP layer 62 which has a carrier concentration lower than that in the n-type GaP layer 61, and a p-type GaP layer 63 are formed on an n-type GaP single crystal substrate 60, and said low-carrier-concentration p-type GaP layer 62 functions as the light emitting layer.

In the low-carrier-concentration p-type GaP layer 62 (doped with Zn) of this GaP pure green light emitting diode, the carrier concentration ($N_A$ (acceptor concentration) $- N_D$ (donor concentration)) is kept low by adding shallow donors (impurities) such as S (sulfur) in the range of the concentration $N_D$, $1 \times 10^{16} \leq N_D \leq 3 \times 10^{17}$ atoms/cm$^3$, and the shallow donors in the low-carrier-concentration p-type GaP layer 62 become light emitting centers.

However, even with the conventional GaP pure green light emitting diodes as described above, pure green light emission with a enough high brightness could not be obtained, and so GaP pure green light emitting diodes, which would give pure green light emission with even higher brightness, have been desired.

BRIEF SUMMARY OF THE INVENTION

Therefore, the object of this invention is to provide a GaP pure green light emitting element substrate which allows to manufacture GaP light emitting diodes which emit pure green light at high brightness.

This invention provides a GaP pure green light emitting element substrate comprising at least one n-type GaP layer and at least one p-type GaP layer formed on a GaP single crystal substrate, characterized by the fact that an intermediate GaP layer is formed at the pn junction portion between said n-type GaP layer and said p-type GaP layer, wherein said intermediate GaP layer has a donor concentration $N_D$ of less than $1 \times 10^{16}$ atoms/cm$^3$ and an acceptor concentration $N_A$ nearly equal to the donor concentration $N_D$.

The thickness of said intermediate GaP layer is preferably in the range of 3–5 micrometers. Said donor impurity is S (sulfur) and/or Si (silicon), for example, and said acceptor impurity is C (carbon), for example. The conductive type of said intermediate GaP layer can be either p-type or n-type.

In this invention, by providing an intermediate GaP layer, which has low concentrations of both donors and acceptors, at the pn junction portion between the p-type GaP layer and the n-type GaP layer, the hole injection efficiency from the p-type GaP layer to the n-type GaP layer and/or the electron injection efficiency from the n-type GaP layer to the p-type GaP layer is enhanced. The thickness of this intermediate GaP layer is set to approximately 3–5 micrometers so that the carriers can pass through this intermediate GaP layer and then reach the n-type GaP layer and/or the p-type GaP layer, thus the radiative recombination occurs sufficiently in the n-type GaP layer with a high donor concentration and/or in the p-type GaP layer with a high acceptor concentration, resulting in enough efficient emission of pure green light.

Examples of the GaP pure green light emitting element substrate of this invention are described next by referring to drawings. It is needless to say that this invention is not limited to the examples and that various changes are possible within the range which does not deviate from the aim of this invention.

DETAILED DESCRIPTION

Figure 1:
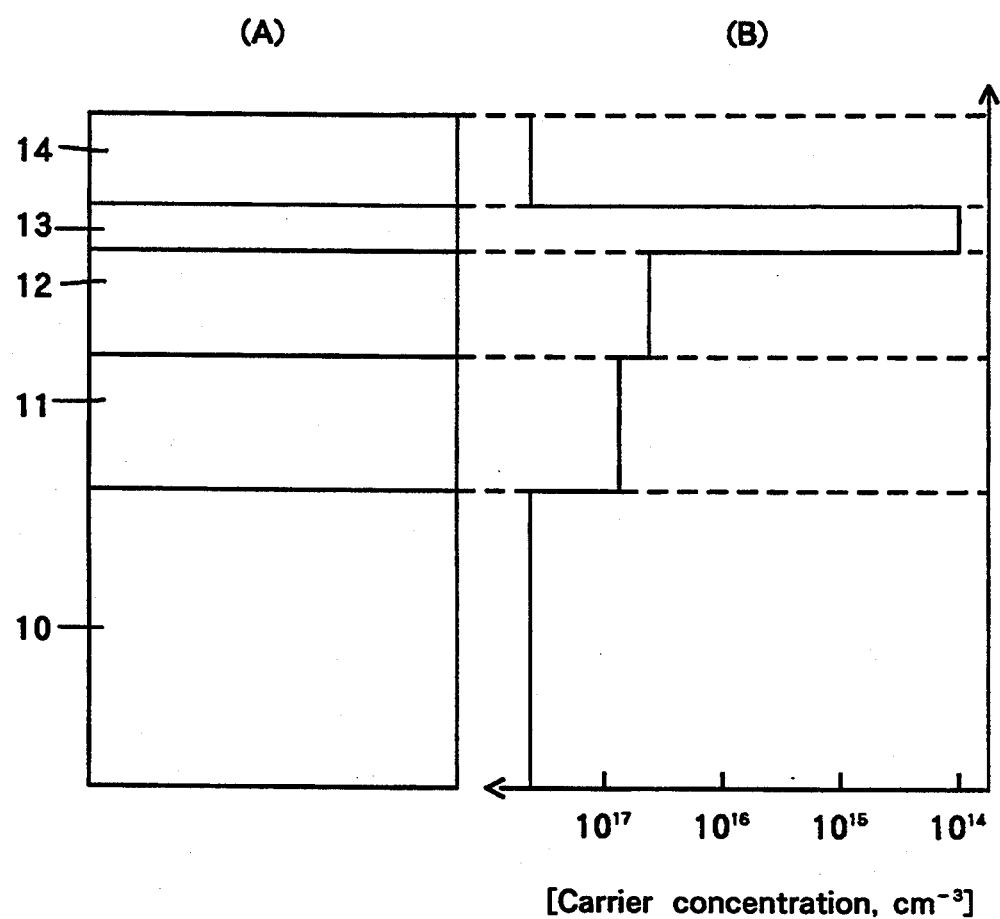
FIG. 1 (A and B) shows one example of the GaP pure green light emitting element substrate of this invention. (A) is its cross section, and (B) shows the distribution of carrier concentration in each layer.

FIG. 1 shows a cross-sectional structure of one example of the GaP pure green light emitting element substrate of this invention and the distribution of carrier concentration in each layer. The structure of the GaP pure green light emitting element substrate of this example follows: as shown in FIG. 1 (A), a n-type GaP buffer layer 11 to which Te and such is added as an impurity and a n-type GaP layer 12 to which S (sulfur) and such are added as impurities are formed on a n-type GaP single crystal substrate 10 to which Te and such are added as impurities, and, as the topmost layer, a p-type GaP layer 14 to which Zn and such are added as impurities, is formed, wherein an intermediate GaP layer 13 with a thickness of 3-5 micrometer is formed between said n-type GaP layer 12 and p-type GaP layer 14.

S (sulfur) and/or Si (silicon) which are to be donors and C (carbon) and such which are to be acceptors are added to the intermediate layer 13. The donor concentration $N_D$ and the acceptor concentration $N_A$ are both set to be low and nearly equal to each other. That is, as shown in FIG. 1 (B), the net donor concentration or the net acceptor concentration in the intermediate GaP layer 13 is approximately $1 \times 10^{14}$ atoms/cm$^3$, indicating a very weak p-type or n-type, substantially nearly neutral.

Figure 2:
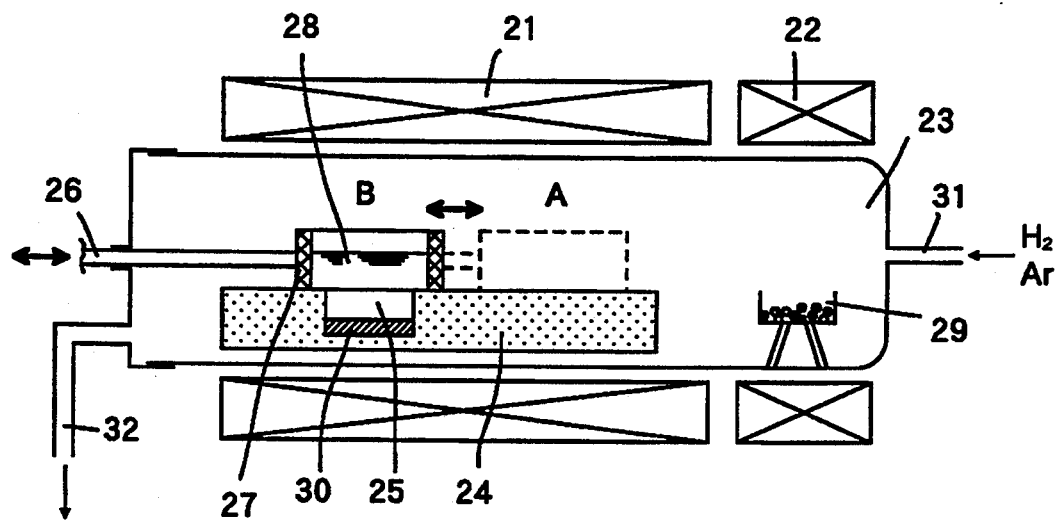
FIG. 2 shows the configuration of one example of the liquid phase epitaxial growth apparatus used for growing each layer of the GaP pure green light emitting substrate of this invention by means of the liquid phase epitaxial growth method.

One example of the manufacturing method of said GaP pure green light emitting element substrate is described next. FIG. 2 shows the configuration of the liquid phase epitaxial growth apparatus used for growing each layer on the GaP single crystal substrate 10.

In FIG. 2, a process tube 23 accommodates in it a carbon slide boat 24 which has a wafer chamber 25 containing a substrate 30 (comprising an n-type GaP buffer layer 11 already formed on an n-type GaP single crystal substrate 10). On the slide boat 24, a solution reservoir 27, which contains a Ga solution 28 and has an opening at the bottom, is provided in such a way that it can be slid by a sliding rod 26.

In the process tube 23, Zn 29, which is to be a p-type dopant, is placed on the carrier gas supply port 31 side. On the periphery of the process tube 23, a main heater 21 to heat the area around the solution reservoir 27 and a sub heater 22 to heat the area around Zn 29 are provided.

A carrier gas composed of a mixed gas of $H_2$ and Ar is fed into the process tube 23 through the carrier gas supply port 31 and discharged from a gas discharge port 32.

Figure 3:
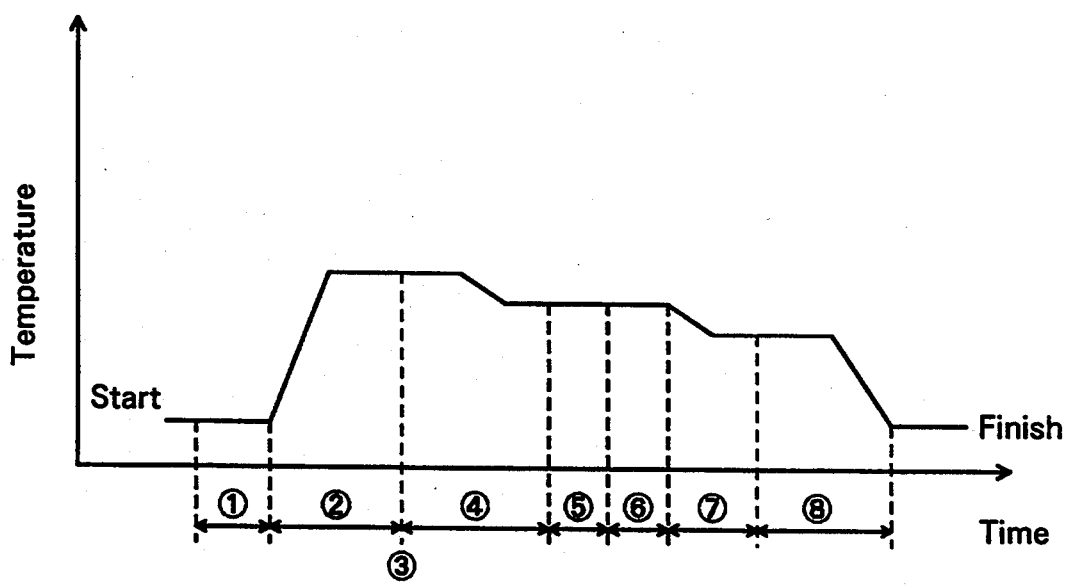
FIG. 3 shows the growth program for growing each layer of the GaP pure green light emitting substrate of this invention by means of the liquid phase epitaxial growth method.

FIG. 3 shows a growth program for growing, one after another, an n-type GaP layer 12, an intermediate GaP layer 13 and a p-type GaP layer 14 on a substrate 30 comprising an GaP buffer layer 11 formed on a GaP single crystal substrate 10. The actual growth procedure is described below.

(1) Appropriate amounts of molten Ga, GaP polycrystals and S (sulfur) are placed in the solution reservoir 27, and the solution reservoir 27 is placed at position A in FIG. 2.

(2) The temperature of the main heater is raised so that the temperature of the solution reservoir 27 is raised to approximately 1000° C. to dissolve the GaP polycrystals and the dopant S (sulfur) in the molten Ga, thus obtaining a Ga solution 28.

(3) The solution reservoir 27 is slid from position A to position B, the Ga solution 28 is poured into the wafer chamber 25, and then the solution reservoir 27 is returned to position A.

(4) The temperature of the main heater 21 is lowered at a constant temperature lowering rate to a prescribed temperature to grow the n-type GaP layer 12 on the substrate 30.

(5) The inside of the process tube 23 is depressurized (several Torr to several tens of Torr) to volatilize the n-type dopant S (sulfur) in the Ga solution.

(6) The carrier gas flow ($H_2$, Ar) is provided.

(7) Without raising the temperature of the sub heater 22, the temperature of the main heater 21 is lowered at a constant temperature lowering rate by several °C. to several tens of °C. so as to grow the intermediate GaP layer 13 with low concentrations of both the n-type dopant S (sulfur) and the p-type dopant on the n-type GaP layer 12.

(8) The temperature of the sub heater 22 is raised to evaporate Zn 29, and simultaneously, the temperature of the main heater 21 is lowered at a constant temperature lowering rate down to a prescribed temperature so that the p-type GaP layer 14 is grown on the intermediate GaP layer 13.

The GaP light emitting element substrate thus obtained is made into elements to obtain light emitting elements (light emitting diodes) which emit pure green light.

Figure 4:
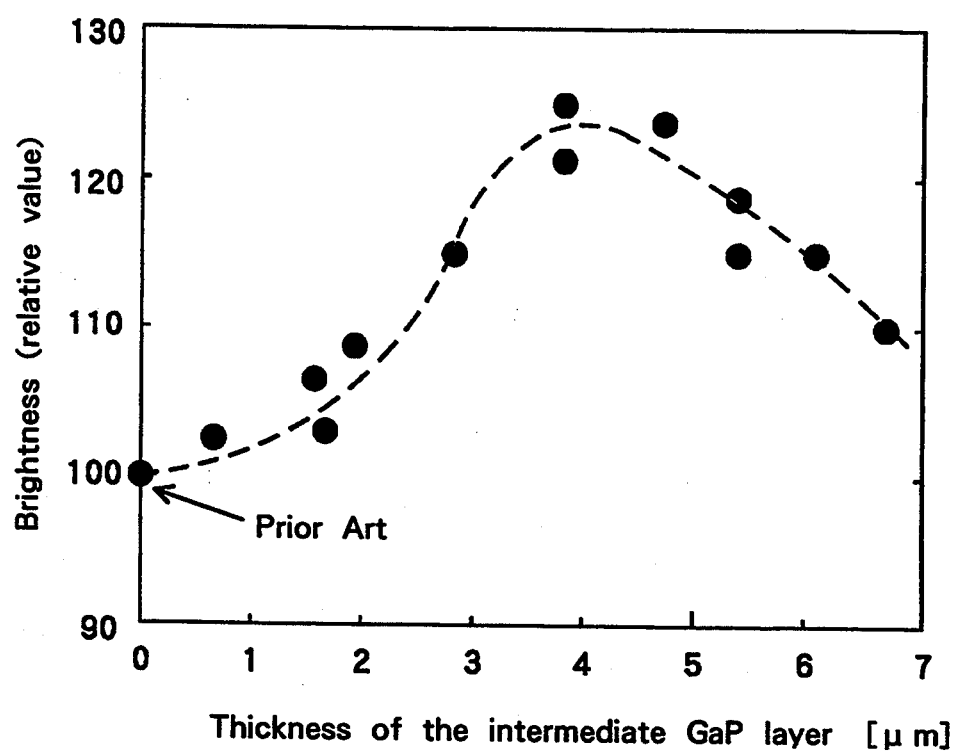
FIG. 4 shows the relationship between the brightness (relative value) of the GaP pure green light emitting element obtained from the GaP pure green light emitting substrate of this invention and the thickness of the intermediate GaP layer 13.
Figure 5:
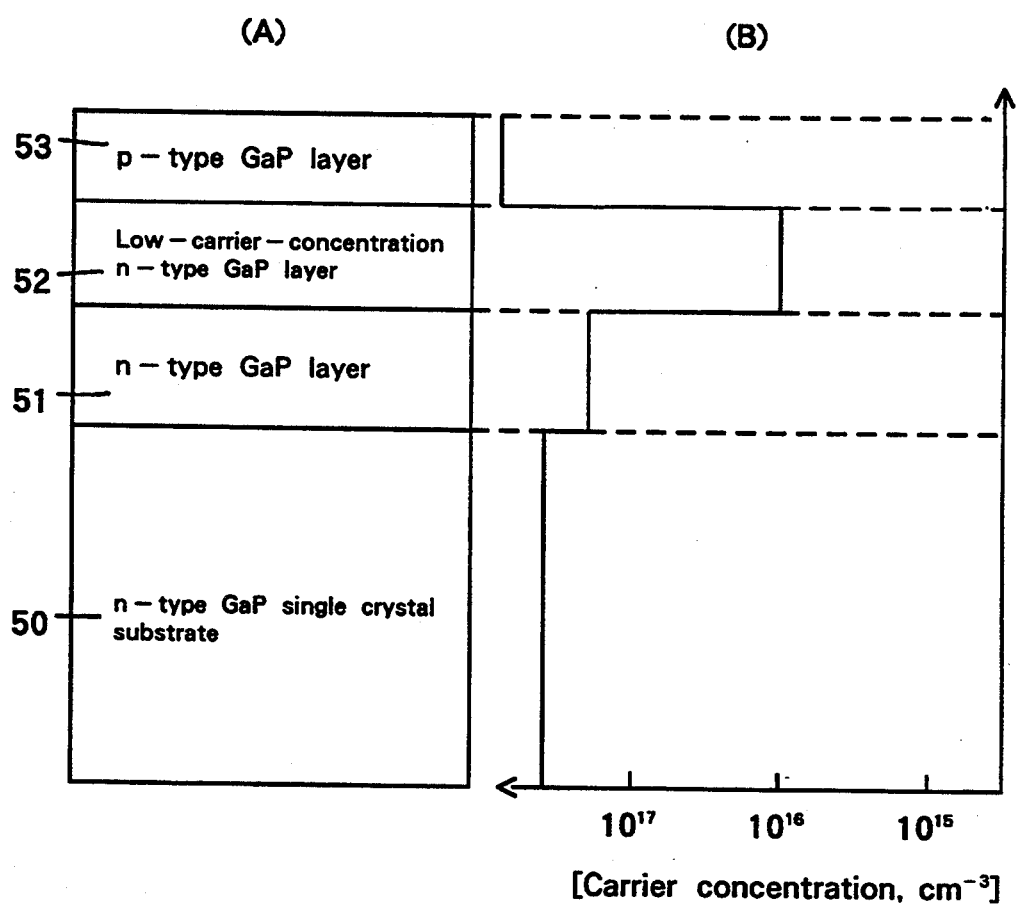
FIG. 5 (A and B) shows one example of a conventional GaP pure green light emitting diode. (A) is its cross section (electrodes are not shown), and (B) shows the distribution of carrier concentration in each layer.
Figure 6:
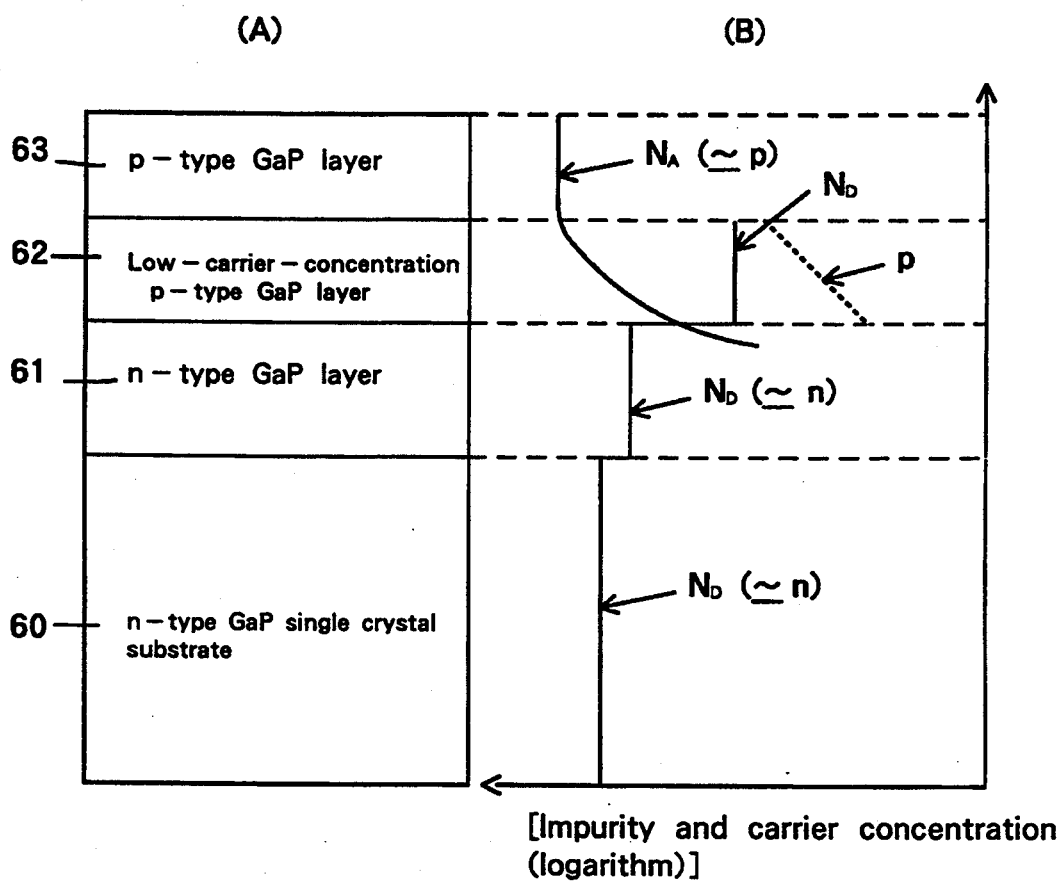
FIG. 6 (A and B) shows another example of a conventional GaP pure green light emitting diode. (A) is its cross section (electrodes are not shown), and (B) shows the distribution of carrier concentration in each layer.

FIG. 4 shows the relationship between the thickness of the intermediate GaP layer 13 and the brightness (relative values) of the GaP pure green light emitting elements obtained from the GaP light emitting element substrate described above. In this figure, the brightness at zero thickness of the intermediate layer corresponds to the brightness of the conventional method. The figure indicates that the maximum of the brightness appears when the thickness of the intermediate GaP layer 13 is approximately 4 micrometers, and the brightness is improved by 15% or more when the thickness of the intermediate GaP layer 13 is in the range of 3–5 micrometers as compared with that in the conventional method.

As described thus far, this invention makes it possible to obtain GaP light emitting elements which emit pure green light at high-brightness and whose brightness is improved by as much as approximately 20% over conventional pure green light emitting elements.

We claim:

1. A GaP pure green light emitting element substrate comprising at least one n-type GaP layer and at least one p-type GaP layer formed on a GaP single crystal substrate, characterized by the fact that an intermediate GaP layer is formed at the pn junction portion between said n-type GaP layer and said p-type GaP layer, wherein said intermediate GaP layer has a donor concentration $N_D$ of less than $1 \times 10^{16}$ atoms/cm$^3$ and an acceptor concentration $N_A$ nearly equal to the donor concentration $N_D$.

2. A GaP pure green light emitting element substrate as described in claim 1 wherein the thickness of said intermediate GaP layer is in the range of 3–5 micrometers.

3. A GaP pure green light emitting element substrate as described in claim 1 wherein said donor impurity is S (sulfur) and/or Si (silicon), and said acceptor impurity is C (carbon).

* * * * *